US009646783B1

(12) United States Patent
Stoufer et al.

(10) Patent No.: US 9,646,783 B1
(45) Date of Patent: May 9, 2017

(54) ENCODER ASSEMBLY FOR AN APPLIANCE KNOB

(71) Applicant: ELECTROLUX HOME PRODUCTS, INC., Charlotte, NC (US)

(72) Inventors: Paul Stoufer, Lincolnton, NC (US); Thomas Josefsson, Concord, NC (US); Kevin Carpenter, Morrisville, NC (US)

(73) Assignee: Electrolux Home Products, Inc., Charlotte, NC (US)

( * ) Notice: Subject to any disclaimer, the term of this patent is extended or adjusted under 35 U.S.C. 154(b) by 0 days.

(21) Appl. No.: 15/089,055

(22) Filed: Apr. 1, 2016

(51) Int. Cl.
| | |
|---|---|
| *H03M 1/22* | (2006.01) |
| *H01H 19/02* | (2006.01) |
| *G05G 1/10* | (2006.01) |
| *H01H 19/14* | (2006.01) |
| *H01H 19/54* | (2006.01) |
| *G01D 5/26* | (2006.01) |
| *G01D 5/14* | (2006.01) |
| *G01D 5/02* | (2006.01) |
| *H03M 1/00* | (2006.01) |

(52) U.S. Cl.
CPC ............. *H01H 19/02* (2013.01); *G05G 1/10* (2013.01); *H01H 19/14* (2013.01); *H01H 19/54* (2013.01); *G01D 5/02* (2013.01); *G01D 5/14* (2013.01); *G01D 5/26* (2013.01); *H03M 1/00* (2013.01)

(58) Field of Classification Search
CPC ...................................................... H03M 1/00
USPC ...................... 341/16, 11, 13, 10, 9, 15, 3
See application file for complete search history.

(56) References Cited

U.S. PATENT DOCUMENTS

2009/0295552 A1* 12/2009 Shahoian ............... G06F 3/016
340/407.1

* cited by examiner

*Primary Examiner* — Joseph Lauture
(74) *Attorney, Agent, or Firm* — Womble Carlyle Sandridge & Rice LLP (57) ABSTRACT

A knob assembly is provided that includes a knob having a rotatable shaft, a rotatable first circuit board rigidly attached to the rotatable shaft, and a fixed second circuit board positioned near the first circuit board. The first circuit board includes an encoding portion configured to provide positioning data of the knob, and an eccentric rotating mass (ERM) motor mounted to the rotatable, first circuit board with a shaft of the ERM motor perpendicular to the rotatable shaft of the knob. The ERM motor is configured to produce and transfer vibration to the rotatable shaft of the knob. The second circuit board includes a sensor configured to determine a position of the first circuit board and thereby the knob at least in part from the positioning data provided by the encoding portion.

15 Claims, 7 Drawing Sheets

ENCODER ASSEMBLY FOR AN APPLIANCE KNOB

TECHNOLOGICAL FIELD

The present disclosure relates generally to appliances and, in particular, to an encoder for providing knob position sensing for an appliance.

BACKGROUND

Modern appliances may include appropriate components that provide for controlling and/or operating the appliance. In recent years, advancements and continued developments in sensor technology, encoder technology, and/or processing technology have enabled the implementation of sophisticated control units and/or controllers for home appliances. Various operational components of a home appliance may be controlled via a control unit and/or controller in response to various commands or user selections for controlling such components initiated through a control element such as, for example, an appliance knob.

Traditional knobs utilize mechanical components (e.g., detents) to provide user feedback for positioning of the knob. These mechanical components may be fixed and prone to wear over time. Therefore, it may be desirable to have an appliance and method that take into account at least some of the issues discussed above, as well as possibly other issues.

BRIEF SUMMARY

Example implementations of the present disclosure provide an improved knob assembly and an appliance or machine having the knob assembly therein. The present disclosure includes, without limitation, the following example implementations:

Example Implementation 1

A knob assembly comprising a knob having a rotatable shaft, and a rotatable, first circuit board rigidly attached to the rotatable shaft of the knob, and a fixed, second circuit board positioned near the first circuit board. The first circuit board includes an encoding portion configured to provide positioning data of the knob, and an eccentric rotating mass (ERM) motor mounted to the rotatable, first circuit board with a shaft of the ERM motor perpendicular to the rotatable shaft of the knob in which the ERM motor is configured to produce and transfer vibration to the rotatable shaft of the knob. The second circuit board includes a sensor configured to determine a position of the first circuit board and thereby the knob at least in part from the positioning data provided by the encoding portion.

Example Implementation 2

The knob assembly of the preceding or subsequent example implementation, or combinations thereof, wherein the second circuit board being positioned near the first circuit board includes the second circuit board being positioned no greater than one millimeter away from the first circuit board.

Example Implementation 3

The knob assembly of any preceding or subsequent example implementation, or combinations thereof, wherein the first circuit board includes arcuate-shaped conductive traces, and the second circuit board includes respective spring finger contacts that slidably engage the conductive traces and thereby establish an electrical connection between the first circuit board and second circuit board, and maintain the electrical connection as the first circuit board is rotated.

Example Implementation 4

The knob assembly of any preceding or subsequent example implementation, or combinations thereof, wherein the encoding portion includes an arcuate-shaped section configured to provide positioning data limited to less than ninety degrees in opposing rotational directions from a registration position of the knob.

Example Implementation 5

The knob assembly of any preceding or subsequent example implementation, or combinations thereof, wherein the encoding portion includes a codewheel, the sensor includes an optical encoder, and the codewheel and optical encoder form an optical rotary encoder.

Example Implementation 6

The knob assembly of any preceding or subsequent example implementation, or combinations thereof, wherein the encoding portion and sensor are components of and form an inductive or capacitive rotary encoder.

Example Implementation 7

The knob assembly of any preceding or subsequent example implementation, or combinations thereof, wherein the knob is operatively coupled to an appliance, and the first and second circuit board are mounted anterior to a front panel of the appliance.

Example Implementation 8

The knob assembly of any preceding or subsequent example implementation, or combinations thereof, wherein the knob is operatively coupled to an appliance, and the first and second circuit board are mounted posterior to a front panel of the appliance.

Example Implementation 9

A knob assembly comprising a knob having a rotatable shaft; a rotatable, first circuit board rigidly attached to the rotatable shaft of the knob, a fixed, second circuit board positioned near the first circuit board, a self-centering spring-return mechanism. The first circuit board includes an encoding portion configured to provide positioning data of the knob, and an eccentric rotating mass (ERM) motor mounted to the rotatable, first circuit board with a shaft of the ERM motor perpendicular to the rotatable shaft of the knob in which the ERM motor is configured to produce and transfer vibration to the rotatable shaft of the knob, and wherein the encoding portion includes an arcuate-shaped section configured to provide positioning data limited to less than ninety degrees in opposing rotational directions from a registration position of the knob.

The second circuit board includes a sensor configured to determine a position of the first circuit board and thereby the knob at least in part from the positioning data provided by the encoding portion. The self-centering spring-return mechanism is configured to enable momentary rotation of the knob in opposing rotational directions from the registration position, and limit the momentary rotation in either of the opposing rotational directions to the less than ninety degrees for which the arcuate-shaped section of the encoding portion is configured to provide positioning data.

Example Implementation 10

The knob assembly of any preceding or subsequent example implementation, or combinations thereof, wherein the second circuit board being positioned near the first circuit board includes the second circuit board being positioned no greater than one millimeter away from the first circuit board.

Example Implementation 11

The knob assembly of any preceding or subsequent example implementation, or combinations thereof, wherein the first circuit board includes arcuate-shaped conductive traces, and the second circuit board includes respective spring finger contacts that slidably engage the conductive traces and thereby establish an electrical connection between the first circuit board and second circuit board, and maintain the electrical connection as the first circuit board is rotated.

Example Implementation 12

The knob assembly of any preceding or subsequent example implementation, or combinations thereof, wherein the encoding portion includes a codewheel, the sensor includes an optical encoder, and the codewheel and optical encoder form an optical rotary encoder.

Example Implementation 13

The knob assembly of any preceding or subsequent example implementation, or combinations thereof, wherein the encoding portion and sensor are components of and form an inductive or capacitive rotary encoder.

Example Implementation 14

The knob assembly of any preceding or subsequent example implementation, or combinations thereof, wherein the knob is operatively coupled to an appliance, and the first and second circuit board are mounted anterior to a front panel of the appliance.

Example Implementation 15

The knob assembly of any preceding or subsequent example implementation, or combinations thereof, wherein the knob is operatively coupled to an appliance, and the first and second circuit board are mounted posterior to a front panel of the appliance.

These and other features, aspects, and advantages of the present disclosure will be apparent from a reading of the following detailed description together with the accompanying drawings, which are briefly described below. The present disclosure includes any combination of two, three, four, or more features or elements set forth in this disclosure, regardless of whether such features or elements are expressly combined or otherwise recited in a specific implementation description herein. This disclosure is intended to be read holistically such that any separable features or elements of the disclosure, in any of its aspects and implementations, should be viewed as intended, namely to be combinable, unless the context of the disclosure clearly dictates otherwise.

It will therefore be appreciated that the above Summary is provided merely for purposes of summarizing some example implementations so as to provide a basic understanding of some aspects of the disclosure. As such, it will be appreciated that the above described example implementations are merely examples of some implementations and should not be construed to narrow the scope or spirit of the disclosure in any way. It will be appreciated that the scope of the disclosure encompasses many potential implementations, some of which will be further described below, in addition to those here summarized. Further, other aspects and advantages of implementations disclosed herein will become apparent from the following detailed description taken in conjunction with the accompanying drawings which illustrate, by way of example, the principles of the described implementations.

BRIEF DESCRIPTION OF THE DRAWING(S)

Having thus described example implementations of the disclosure in general terms, reference will now be made to the accompanying drawings, which are not necessarily drawn to scale, and wherein:

DETAILED DESCRIPTION

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless otherwise indicated, reference something as being a first, second or the like should not be construed to imply a particular order. Like reference numerals refer to like elements throughout. Also, for example, reference may be made herein to quantitative measures, values, relationships or the like. Unless otherwise stated, any one or more if not all of these may be absolute or approximate to account for acceptable variations that may occur, such as those due to engineering tolerances or the like.

Example implementations of the present disclosure are generally directed to a knob assembly for a machine such as an appliance. The knob assembly may be suitable for any of a number of different machines including any of a number of different appliances. Examples of suitable appliances include major appliances (white goods), small appliances and the like. Examples of suitable appliances include dishwashers, washing machines, clothes dryers, refrigerators, freezers, ovens, ranges, cooktops, microwave ovens, trash compactors, air conditioners, vacuum cleaners, water heaters or the like.

Figure 1A:
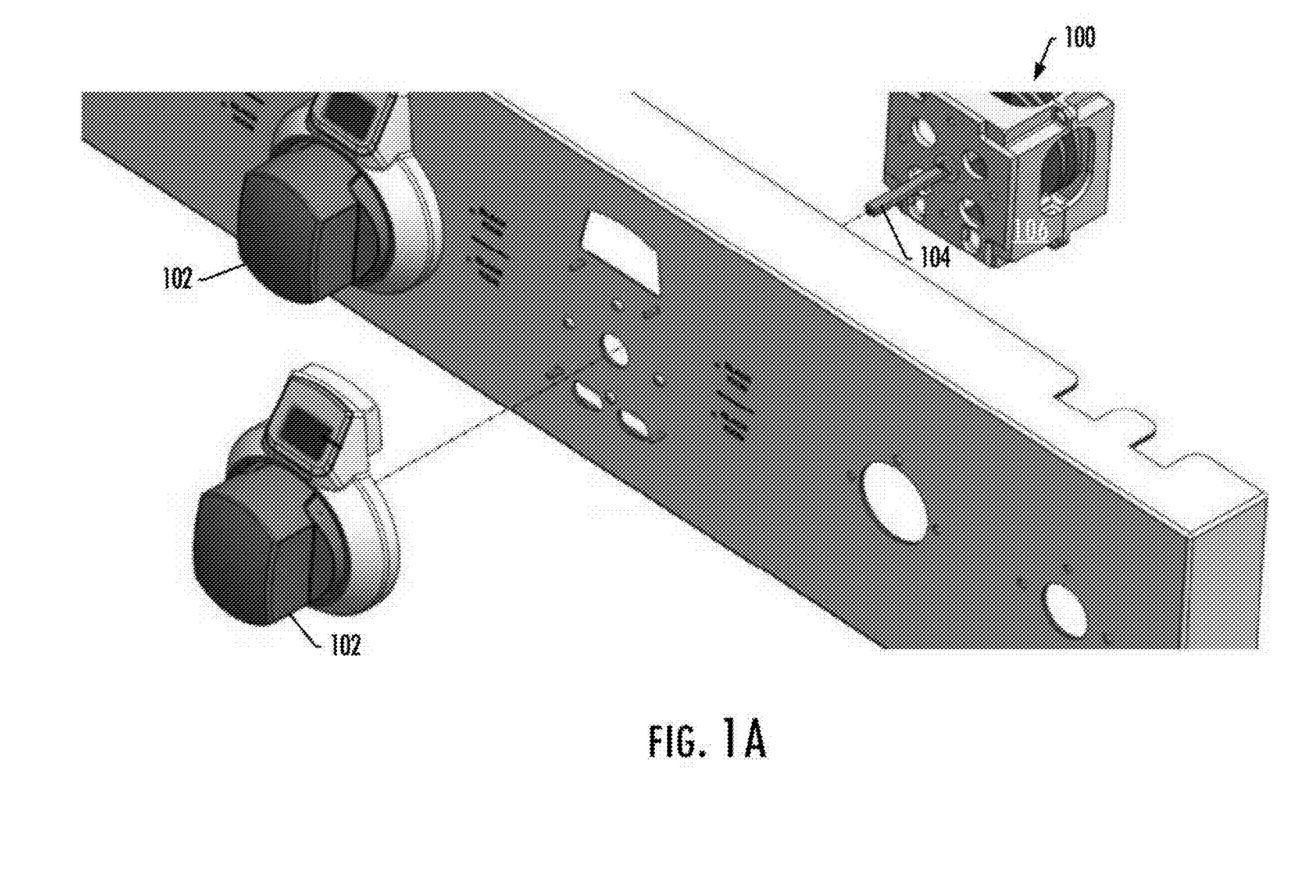
FIG. 1A illustrates an appliance panel having a knob assembly disposed therein, according to one aspect of the present disclosure.
Figure 1B:
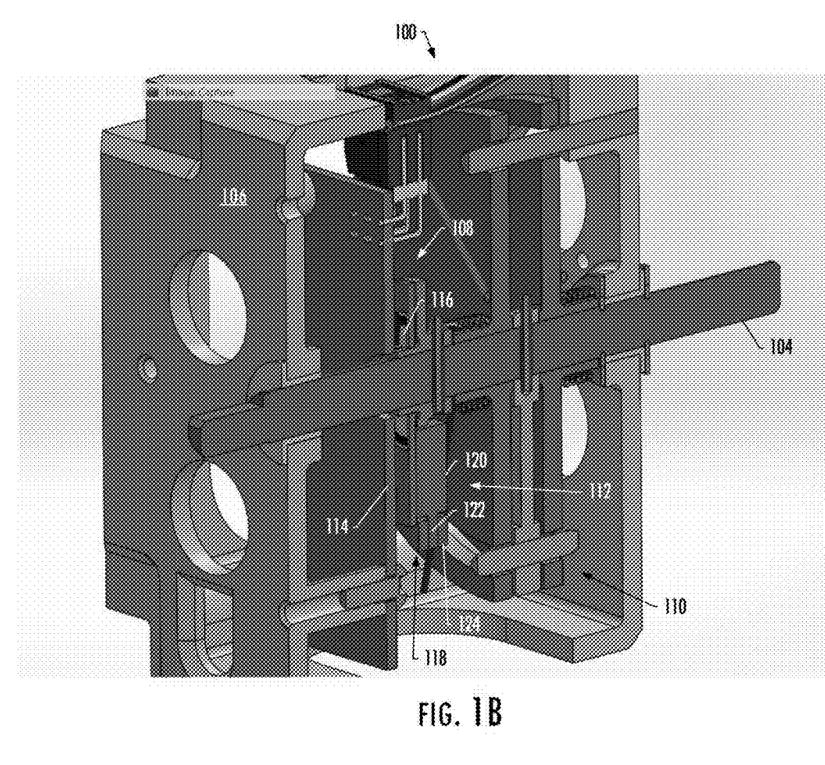
FIG. 1B illustrates a cross-sectional view of the knob assembly of FIG. 1A, having an encoder assembly disposed in a housing thereof, according to one aspect of the present disclosure.

FIG. 1A illustrates an appliance panel having a knob assembly 100 disposed therein, and FIG. 1B more particularly illustrates the knob assembly of FIG. 1, according to some example implementations. As shown, the knob assembly may include a knob 102 having a rotatable shaft 104 extending through a housing 106. The knob assembly may also include an encoder assembly 108 within the housing, and which may be generally configured to provide accurate positioning data of the knob with haptic feedback. The knob assembly may also include a self-centering spring-return mechanism 110 configured to enable momentary rotation of the knob in opposing rotational directions from a registration position. Further information regarding the encoder assembly according to various example implementations is provided below.

In accordance with example implementations of the present disclosure, the encoder assembly 108 may include a rotatable, first circuit board 112 rigidly attached to the rotatable shaft 104 of the knob 102, and a fixed, second circuit board 114 positioned near (e.g., no greater than one millimeter from) the first circuit board. In some examples, the knob assembly and knob may be operatively coupled to an appliance, and the encoder assembly including first and second circuit boards may be mounted anterior to a front panel of the appliance. In other examples, the encoder assembly including first and second circuit boards may be mounted posterior to a front panel of an appliance.

Figure 2:
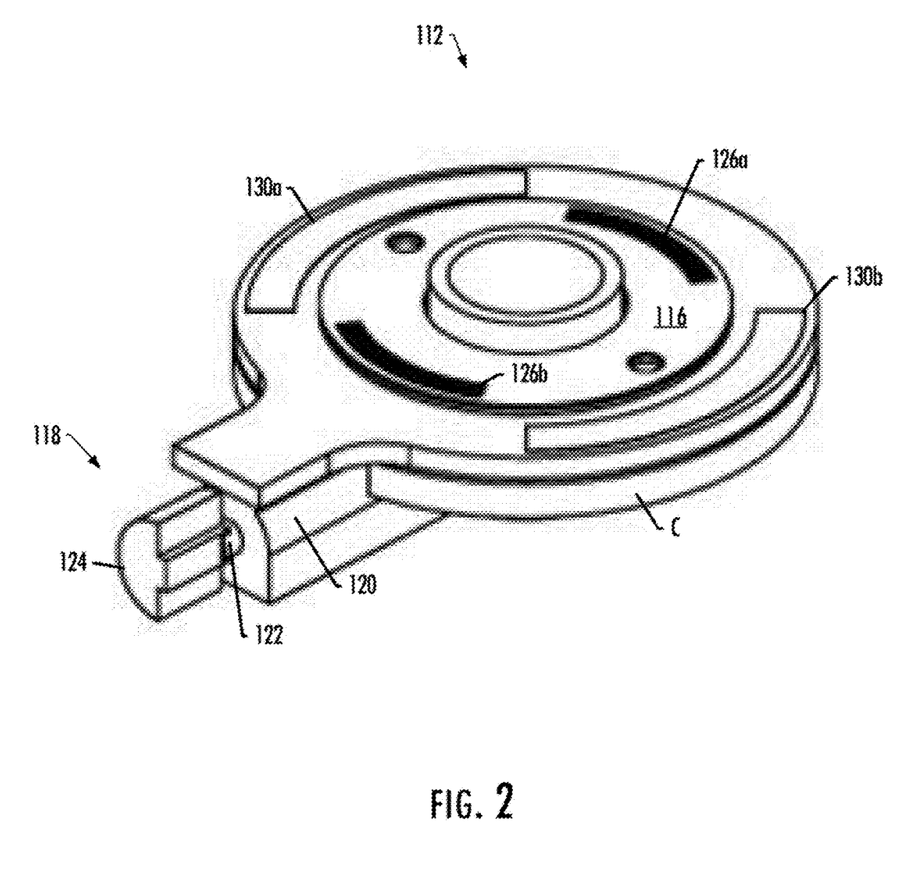
FIGS. 2, 3 and 4 illustrate a first circuit board of the encoder assembly of FIG. 1B, according to an example implementation of the present disclosure.
Figure 3:
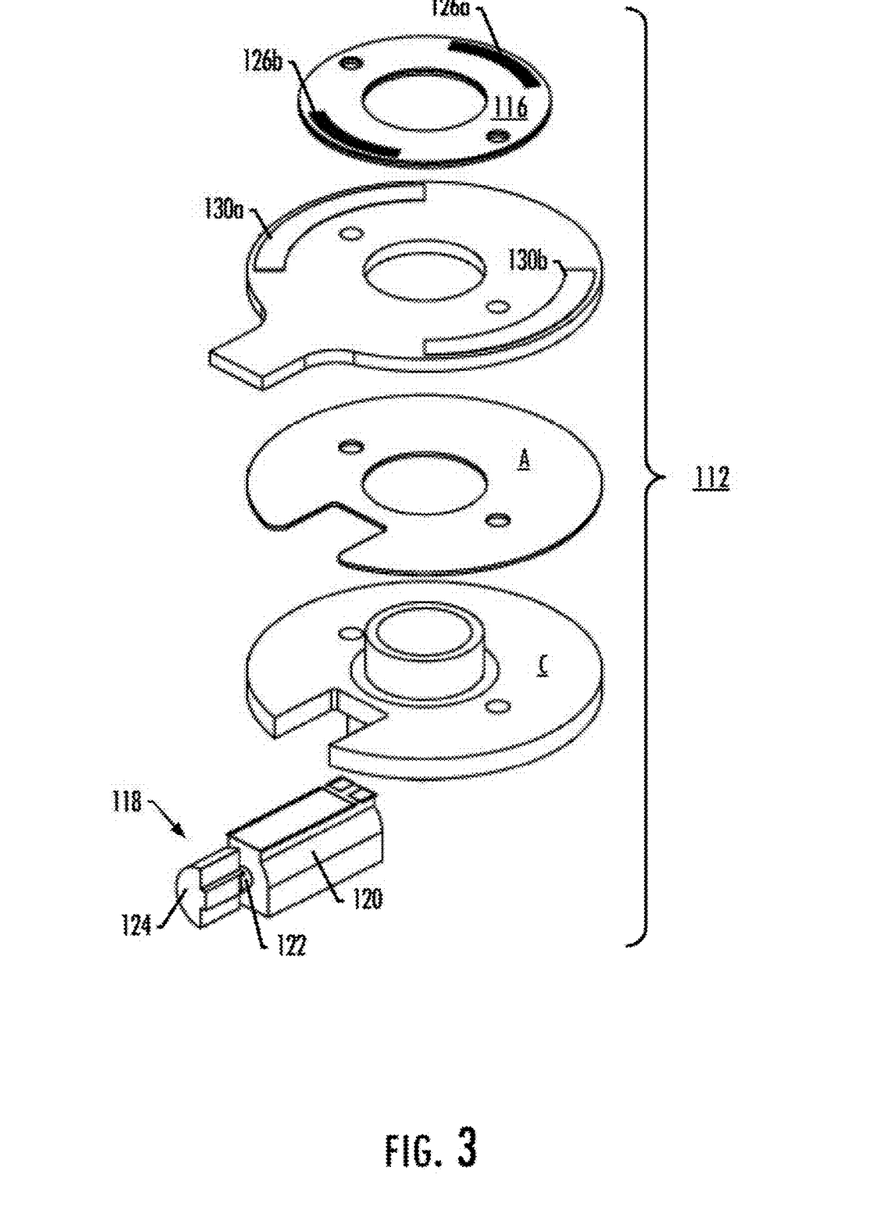
Figure 4:
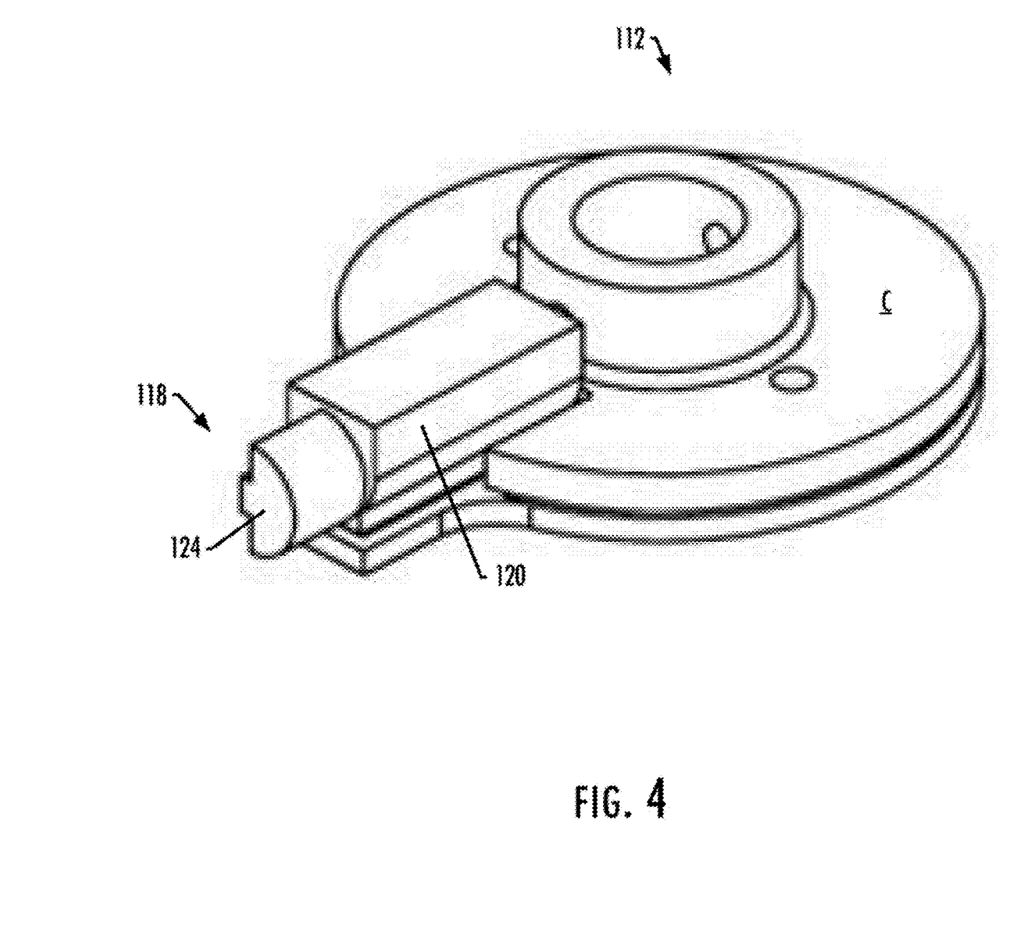

FIGS. 2-4 and FIGS. 5-7 more particularly illustrate respectively the first circuit board 112 and second circuit board 114 of FIG. 1, according to some example implementations of the present disclosure. As shown in FIG. 1 and more particularly FIGS. 2-4, the first circuit board may include an encoding portion configured to provide positioning data of the knob 102. As illustrated in FIGS. 1-3, the encoding portion may be or include a codewheel 116. The first circuit board may also include an eccentric rotating mass (ERM) motor 118 having a direct current (DC) motor 120 with a shaft 122 to which an offset mass 124 is attached. The ERM motor may be mounted to the first circuit board with its shaft perpendicular to the rotatable shaft 104 of the knob, and may be configured to produce and transfer vibration to the rotatable shaft. Alternatively, the ERM motor may be mounted directly to or within the rotatable shaft, or in any another suitable manner, for transferring vibration to the rotatable shaft. Further, in some examples, the first circuit board may include a haptic feedback device (e.g., piezoelectric actuators, and the like) other than the ERM motor for transferring vibration directly into the rotatable shaft.

In some examples, as shown in particular in FIGS. 2 and 3, the code wheel 116 (encoding portion) of the first circuit board 112 may include an (one or more) arcuate-shaped section (two being shown as arcuate-shaped sections 126a, 126b) configured to provide positioning data limited to less than ninety degrees in opposing rotational directions from a registration position of the knob 102. And referring again to FIG. 1, in these examples, the self-centering spring-return mechanism 110 may be configured to enable momentary rotation of the knob in opposing rotational directions from the registration position. The self-centering spring-return mechanism may also limit the momentary rotation in either of the opposing rotational directions to the less than ninety degrees for which the arcuate-shaped section of the encoding portion is configured to provide positioning data. It should be noted, that in alternate implementations, the (one or more) arcuate-shaped section may be configured to provide positioning data of ninety degrees or more in opposing rotational directions from a registration position of the knob, and the self-centering spring-return mechanism may limit the momentary rotation in either of the opposing rotational directions to the ninety degrees or more for which the arcuate-shaped section of the encoding portion is configured to provide positioning data.

Figure 5:
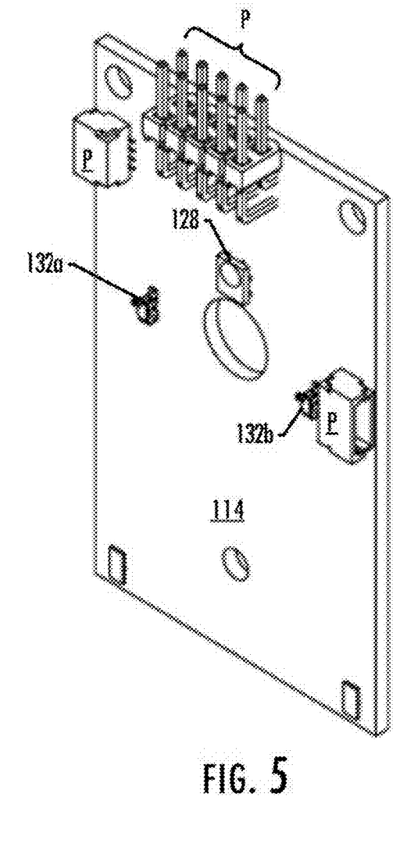
FIGS. 5, 6 and 7 illustrate a second circuit board of the encoder assembly of FIG. 1, according to an example implementation of the present disclosure.
Figure 6:
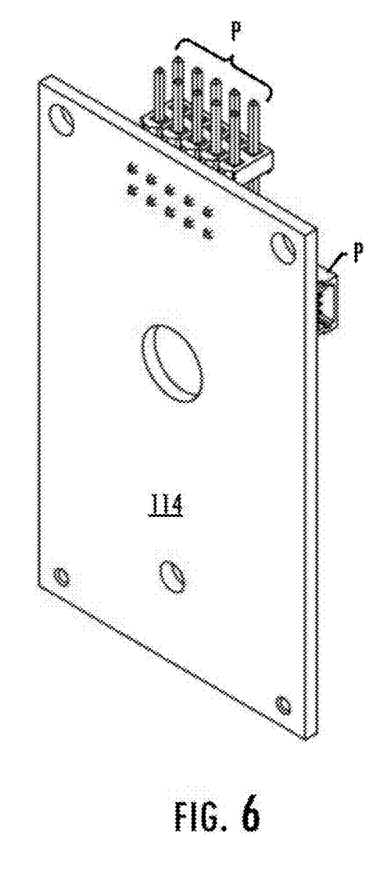
Figure 7:
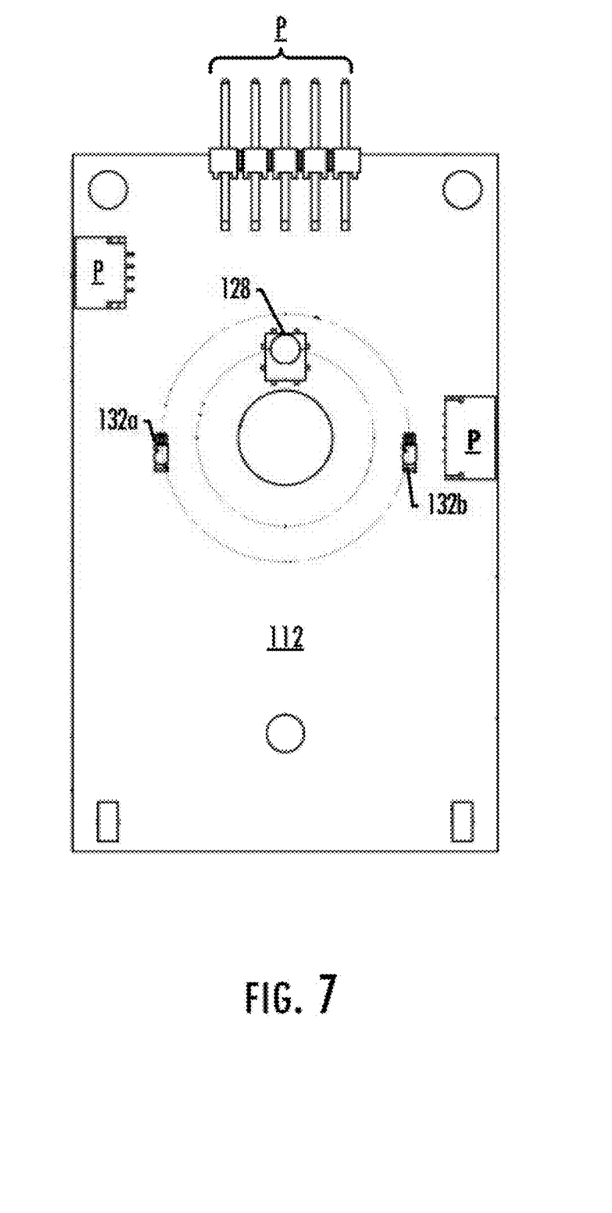

As shown in FIG. 5-7, the second circuit board 114 may include a sensor 128 configured to determine a position of the first circuit board 112 and thereby the knob 102 at least in part from the positioning data provided by the codewheel 116 (encoding portion of the first circuit board). In some examples, the sensor may include an optical encoder, in which the codewheel and optical encoder may form an optical rotary encoder. The optical rotary encoder may be or include a photoelectric rotary encoder such as a reflecting type rotary encoder. In one example implementation, the arcuate-shaped sections 126a, 126b of the codewheel may include a pattern of light and dark areas, and the optical encoder may include a retroreflective sensor configured to identify the various light and dark areas and provide a quadrature output of the knob's position, as well as a top-dead center index signal for zeroing the position of the knob. In another example implementation in which the codewheel and optical encoder specifically form a photoelectric rotary encoder, the photoelectric rotary encoder may include photoelectric sensors, and the codewheel may include slots defined thereon and interpretable by the photoelectric sensors for determining a position of the knob.

In some example implementations, the arcuate-shaped sections 126a, 126b may be placed near an outside edge of the first circuit board 112 to provide increased sensor resolution. Additionally, if the knob is configured to have less than 180° of rotation, the codewheel 116 may include a plurality of spatially-separated, arcuate-shaped sections such that corresponding sensor(s) 128 may provide increased resolution (e.g., multiple sensors for determining a single position).

Accordingly, the codewheel 116 and/or patterns disposed thereon may include slots, holes, gaps, and/or the like. It should be noted that although the illustrated embodiments depict the encoding portion including a codewheel, the encoding portion may alternatively include a number of other encoding mechanisms not explicitly illustrated or stated herein. For example, in some alternative implementations, the encoding portion and sensor 128 are components of and form an inductive or capacitive rotary encoder.

As shown in FIGS. 2, 3 and 7, in some example implementations, the first circuit board 114 may include arcuate-shaped conductive traces 130a, 130b, and the second circuit board 112 may include respective spring finger contacts 132a, 132b. The spring finger contacts may slidably engage the conductive traces and thereby establish an electrical connection between the first circuit board and second circuit board, and maintain the electrical connection as the first circuit board is rotated. In some example implementations, the electrical connection between the first and second circuit boards may be utilized to provide power to the ERM motor 116. In these examples implementations, arcuate-shaped conductive traces may be configured for receiving electrical power from the second circuit board. Accordingly, this configuration may provide for bidirectional rotation, and for multiple rotations, of the first circuit board.

As further shown in FIGS. 2-7, either or both of the first circuit board 112 or second circuit board 114 may also include a number of other electrical and/or mechanical components, such as adhesive A or fasteners, carriers C, pin headers P, and the like, which may be coupled with other components to form respective electromechanical or electrical components. For example, the first circuit board may include an adhesive utilized to attach the first circuit board to a plastic carrier in which the ERM motor 118 is mounted to a surface of the plastic carrier. The second circuit board may include one or more pin headers for establishing an electrical connection between the second circuit board and a control unit of the knob assembly for implementing local and/or independent control of the knob utilizing haptic feedback.

Many modifications and other implementations of the disclosure set forth herein will come to mind to one skilled in the art to which these disclosure pertain having the benefit of the teachings presented in the foregoing descriptions and the associated drawings. Therefore, it is to be understood that the disclosure are not to be limited to the specific implementations disclosed and that modifications and other implementations are intended to be included within the scope of the appended claims. Moreover, although the foregoing descriptions and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A knob assembly comprising:
   a knob having a rotatable shaft;
   a rotatable, first circuit board rigidly attached to the rotatable shaft of the knob, and including:
      an encoding portion configured to provide positioning data of the knob; and
      an eccentric rotating mass (ERM) motor mounted to the rotatable, first circuit board with a shaft of the ERM motor perpendicular to the rotatable shaft of the knob, the ERM motor being configured to produce and transfer vibration to the rotatable shaft of the knob; and
   a fixed, second circuit board positioned near the first circuit board, and including a sensor configured to determine a position of the first circuit board and thereby the knob at least in part from the positioning data provided by the encoding portion.

2. The knob assembly of claim 1, wherein the second circuit board being positioned near the first circuit board includes the second circuit board being positioned no greater than one millimeter away from the first circuit board.

3. The knob assembly of claim 1, wherein the first circuit board includes arcuate-shaped conductive traces, and the second circuit board includes respective spring finger contacts that slidably engage the conductive traces and thereby establish an electrical connection between the first circuit board and second circuit board, and maintain the electrical connection as the first circuit board is rotated.

4. The knob assembly of claim 1, wherein the encoding portion includes an arcuate-shaped section configured to provide positioning data limited to less than ninety degrees in opposing rotational directions from a registration position of the knob.

5. The knob assembly of claim 1, wherein the encoding portion includes a codewheel, the sensor includes an optical encoder, and the codewheel and optical encoder form an optical rotary encoder.

6. The knob assembly of claim 1, wherein the encoding portion and sensor are components of and form an inductive or capacitive rotary encoder.

7. The knob assembly of claim 1, wherein the knob is operatively coupled to an appliance, and the first and second circuit board are mounted anterior to a front panel of the appliance.

8. The knob assembly of claim 1, wherein the knob is operatively coupled to an appliance, and the first and second circuit board are mounted posterior to a front panel of the appliance.

9. A knob assembly comprising:
   a knob having a rotatable shaft;
   a rotatable, first circuit board rigidly attached to the rotatable shaft of the knob, and including:
      an encoding portion configured to provide positioning data of the knob; and
      an eccentric rotating mass (ERM) motor mounted to the rotatable, first circuit board with a shaft of the ERM motor perpendicular to the rotatable shaft of the knob, the ERM motor being configured to produce and transfer vibration to the rotatable shaft of the knob,
      wherein the encoding portion includes an arcuate-shaped section configured to provide positioning data limited to less than ninety degrees in opposing rotational directions from a registration position of the knob;
   a fixed, second circuit board positioned near the first circuit board, and including a sensor configured to determine a position of the first circuit board and thereby the knob at least in part from the positioning data provided by the encoding portion; and
   a self-centering spring-return mechanism configured to enable momentary rotation of the knob in opposing rotational directions from the registration position, and limit the momentary rotation in either of the opposing rotational directions to the less than ninety degrees for which the arcuate-shaped section of the encoding portion is configured to provide positioning data.

10. The knob assembly of claim 9, wherein the second circuit board being positioned near the first circuit board includes the second circuit board being positioned no greater than one millimeter away from the first circuit board.

11. The knob assembly of claim 9, wherein the first circuit board includes arcuate-shaped conductive traces, and the second circuit board includes respective spring finger contacts that slidably engage the conductive traces and thereby establish an electrical connection between the first circuit board and second circuit board, and maintain the electrical connection as the first circuit board is rotated.

12. The knob assembly of claim 9, wherein the encoding portion includes a codewheel, the sensor includes an optical encoder, and the codewheel and optical encoder form an optical rotary encoder.

13. The knob assembly of claim 9, wherein the encoding portion and sensor are components of and form an inductive or capacitive rotary encoder.

14. The knob assembly of claim 9, wherein the knob is operatively coupled to an appliance, and the first and second circuit board are mounted anterior to a front panel of the appliance.

15. The knob assembly of claim 9, wherein the knob is operatively coupled to an appliance, and the first and second circuit board are mounted posterior to a front panel of the appliance.

* * * * *